United States Patent [19]

Horn

[11] Patent Number: 4,618,818

[45] Date of Patent: Oct. 21, 1986

[54] EVALUATION CIRCUITS FOR PASSIVE MEASUREMENT-VARIABLE PICKUPS

[75] Inventor: Klaus Horn, Braunschweig, Fed. Rep. of Germany

[73] Assignee: Siemens Aktiengesellschaft, Munich, Fed. Rep. of Germany

[21] Appl. No.: 643,875

[22] Filed: Aug. 24, 1984

[30] Foreign Application Priority Data

Aug. 26, 1983 [DE] Fed. Rep. of Germany ....... 3330841

[51] Int. Cl.$^4$ .............................................. G01D 1/00
[52] U.S. Cl. ................................ 324/62; 324/DIG. 1
[58] Field of Search ..................... 324/62, DIG. 1, 64, 324/65 R; 330/9, 10

[56] References Cited

U.S. PATENT DOCUMENTS 3,588,690  6/1971  Griffin ............................... 324/62 R
3,875,501  4/1975  Hayashi ............................. 324/62 R
3,944,819  3/1976  Sherwood ............................. 330/10

FOREIGN PATENT DOCUMENTS

2262755  7/1974  Fed. Rep. of Germany .
2841830  1/1980  Fed. Rep. of Germany ... 324/DIG. 1
0112014  8/1980  Japan ..................................... 330/10

Primary Examiner—Reinhard J. Eisenzopf
Assistant Examiner—Jose M. Solis
Attorney, Agent, or Firm—Kenyon & Kenyon

[57] ABSTRACT

An evaluation circuit for a passive measurement variable pickup having resistor sensors disposed in a bridge circuit is disclosed. In one embodiment, a double throw switch alternately connects a balancing resistor across resistors of the bridge circuit. A balancing difference signal is generated by a preamplifier coupled to the output of the bridge circuit. The preamplifier transmits d-c components of the balancing difference signal. The output of the preamplifier is coupled to a phase sensitive rectifier. The preamplifier has a linear phase frequency response and a linear modulation characteristic. The output of the rectifier is coupled to a null amplifier and the balancing resistor is coupled to a polarity reversing switch feeding the bridge circuit by circuitry which passes d-c components, e.g., a conductor, an operational amplifier or a switching device.

19 Claims, 15 Drawing Figures

EVALUATION CIRCUITS FOR PASSIVE MEASUREMENT-VARIABLE PICKUPS

BACKGROUND OF THE INVENTION

The present invention relates to the field of evaluation circuits for passive measurement-variable pickups having ohmic sensor resistors in bridge circuits, wherein adjustment of the output signals of the pickups is made by duration-modulated switching of a resistor which is controlled by an overflow signal of a clock pulse counter into a first switching position, and by the output signal of a digital comparator of the contents of the clock pulse counter and of a sign sensitive voltage-/frequency converter into a second switch position. In circuits of this type, the input voltage of the voltage-/frequency converter comprises an amplified balancing-difference signal which is rectified by a phase-sensitive rectifier and filtered by a lowpass filter. Furthermore, in circuits of this type, current to the pickups and the switchable resistor are supplied by a polarity-reversing switch controlled by the overflow of the clock pulse counter from a d-c current or voltage source, and the phase-sensitive rectifier is controlled synchronously with the polarity-reversing switch.

Such an evaluation circuit is known from German Pat. No. 22 62 755. The evaluation circuit, described therein as a digital compensating device, is to be, as a result, free of the effects of thermo-voltages and contact potentials in the passive measurement-variable pickups and independent of the null drift of a so-called null amplifier.

Figure 1:
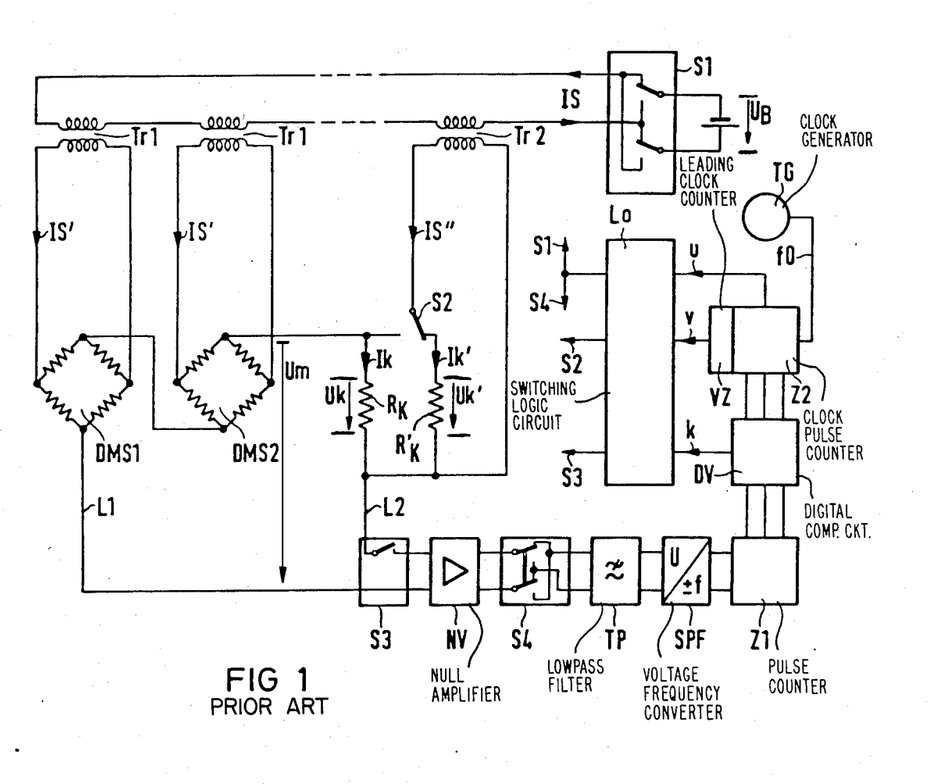

In order to obtain a better understanding of the improvements sought by the present invention over the known circuit, it is necessary to analyze the known circuit critically. Therefore, the known circuit is again shown in FIG. 1 herein. In FIG. 1, two measurement-variable pickups DMS-1 and DMS-2 are illustrated which comprise bridge circuits, of which the feed diagonals are supplied with currents IS' via secondary windings of a current transformer Tr1. The measurement diagonals of the measurement variable pickups DMS-1 and DMS-2 are connected in series. The sum voltage present at the diagonals is designated by Um. In opposition to this sum voltage is a compensation voltage Uk, which is formed by the voltage drop across a compensation resistor $R_K$. The compensation resistor $R_K$ can be connected via a double-throw switch S2 to the secondary winding of a second current transformer Tr2, through which a current IS" flows. A second contact of the double-throw switch S2 is connected to a resistor $R_K'$ which alternatingly can be connected into a secondary circuit of the transformer Tr2. The primary windings of the current transformers Tr1 and Tr2 are connected in series with a d-c current source $U_B$ via a polarity-reversing switch S1. A current IS flows in the primary windings. The difference between the voltages Um and Uk is fed via lines L1 and L2 to a switch S3 which is connected in series with a null amplifier NV. A second polarity-reversing switch S4 is connected to the output terminals of the null amplifier. Its output terminals are connected via a lowpass filter TP to the input terminals of a voltage/frequency converter SPF. The polarity-reversing switch S4 is actuated synchronously with the polarity-reversing switch S1 so that it acts as a contact rectifier. The output terminals of the voltage-/frequency coverter SPF are connected to the forward and backward inputs of a pulse counter Z1. The counting input of a clock pulse counter Z2 is connected to the output of a clock generator TG which furnishes a pulse sequence with the sequence frequency f0. The decade outputs of the counters Z1 and Z2 are connected to comparison inputs of a digital comparison circuit DV. One output of the comparison circuit DV which carries a pulse k indicating agreement of the counter readings z1 and z2, is connected to the input of a switching logic circuit Lo. A transfer pulse u arrives via a connecting line of the highest decade of the clock pulse counter Z2 to a second input of the switching control logic Lo. To a further input of the switching control logic is fed a transfer pulse v of a leading clock counter VZ. One output of the switching control logic controls simultaneously the two double-throw pole switches S1 and S4. Two further outputs of the switching control logic serve for controlling the switches S2 and S3.

Via the switch S1, the polarity of the supply voltage or the supply current, respectively, is changed each time that the clock pulse counter Z2 counts up, due to clock pulses from the clock pulse generator TG to its final counter value $z2_{max}$ and delivers a transfer pulse u.

Via the switching control logic Lo, the switch S2 is switched to the resistor $R_K'$ at the moment at which the clock pulse counter Z2 has the same content as the counter Z1 and therefore, the digital comparison circuit DV indicates by a pulse k the coincidence of the counter readings to the switching control logic Lo. The arithmetic mean $\overline{Uk}$ of the compensation voltage Uk obtained in this manner is therefore directly proportional to the instantaneous counter reading z1 of the counter Z1, referred to the maximum counter reading $z2_{max}$ of the clock pulse counter Z2.

The interrupt switch S3 which is connected through by the switching control logic Lo at the same instant as the switch S2 shifted by the time $\Delta t$ relative to the switch reversal points of the feed current, remains connected through during an entire sampling period $$T_A = Z2_{max} \cdot \frac{1}{f_0}$$

to the next transfer pulse u of the clock pulse counter Z2. The null amplifier NV, the input of which is in series with the switch S3, therefore receives the difference voltage $\Delta U$.

It has been found that the desired aims of the above-described circuit can be attained only unsatisfactorily for the following reasons:

In the automatically balancing compensation circuit of FIG. 1, a control loop of closed design is used in which the null amplifier NV, called a control amplifier in control engineering, serves for the amplification of the control deviation as selectivly as is possible. This control deviation will be called here $\overline{\Delta U}$. It represents the difference of the arithmetic mean values, formed over a switching period $T_A$, of the sum of the pickup signal voltages $\overline{Um}$ and the compensation voltage $\overline{Uk}$ $$\overline{\Delta U} = \overline{Um} - \overline{Uk}$$

Due to the changed polarity of the supply currents IS which change with every switching of the polarity switch S1, $\overline{\Delta U}$ and all other components of the difference voltage $\Delta U$ acting on the input of the null amplifier NV in two successive switching periods $T_{An}$ and $T_{An+1}$ have the opposite sign for the same magnitude. $\overline{\Delta U}$ and $\Delta U$ are therefore a-c voltages with a fundamental frequency $$f_W = \frac{1}{T_W} = \frac{1}{2T_A}$$

without any d-c component.

The following properties are basically required of null amplifiers in control loops:

(a) a high gain in the transmission range of the control deviation;

(b) a null error as small as possible in the amplification of the control deviation;

(c) in the interest of high selectivity and interference suppression, the smallest possible gain outside the transmission range of the control deviation.

Not required, on the other hand, are:

(d) a linear control characteristic;

(e) a frequency response with linear phase, and (f) particular stability of the gain.

With property (c), a null amplifier such as was used in the known circuit, will exhibit in the transmission range $f < f_W$ an amplitude response dropping as steeply as possible toward lower frequencies and will not transmit particularly the frequency 0 Hz, i.e., d-c voltage signals (highpass characteristic).

This, however, has the consequence, due to the adjustment principle which is used here, namely, the duration-modulated switch reversal, that in the resulting squarewave signals $\Delta U$, slanting tops occur which in turn lead to a nonlinearity of the display characteristic which will be explained below in greater detail.

A lack of property (e), i.e., a frequency response without linear phase in the transmission range $f \geq f_W$ of the null amplifier, results in propogation time distortions in the amplification of the difference signal $\Delta U$. These distortions can lead, in the phase-selective rectification of the amplified difference signal $\Delta U$, to the generation of faulty d-c voltage components by the clock-controlled double-throw switch S4, which are not proportional to the control deviation $\overline{\Delta U}$ and represent null errors.

If property (d) is missing, a linear modulation characteristic, even if the latter has rotary symmetry (without even-numbered curvature terms), positive and negative amplitude sections in the voltage response of $\Delta U$ are weighted with different weights. This leads to errors in the formation of the arithmetic mean $\overline{\Delta U}$ of the difference signal which are likewise noted as null errors. The latter, in addition, vary as to magnitude if, as in a conventional null amplifier, also the property (f), especially stability of the gain, is lacking. Since the errors in the formation of the mean are further dependent on the duty cycle $a = t_e/T_A$, null errors depending on a have an additional effect on the indication characteristic as linearity errors.

The shortcomings caused by the properties of the null amplifier NV are further exacerbated by the potential separation provided by the compensation resistor $R_K$ which can be switched on and off, duration-modulated, for the supply current IS'' is compared with the supply current IS' for the measurement-variable pickups by current transformers Tr.

Figure 2:
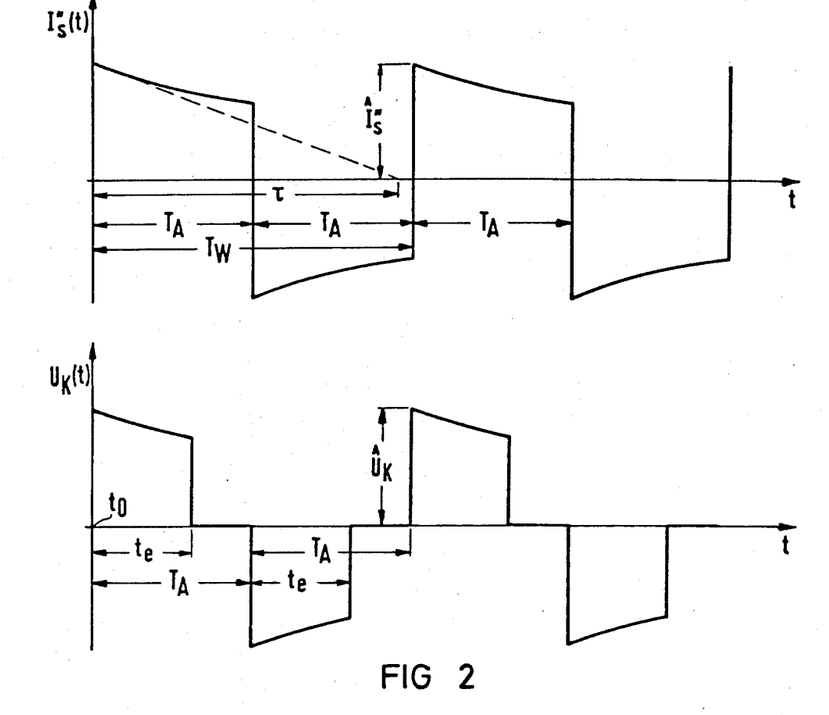

Because of the unavoidable stray inductances of these current transformers as well as the main inductances which can be made only finitely large and the internal resistance, which is only finitely small, of the d-c voltage source which feeds the switch S1, the secondary a-c supply currents IS' and IS'' cannot have an ideal squarewave shape. They rather exhibit slanted tops in the form of exponential functions, as is shown in FIG. 2 of the drawings. The following applies to the feed current of the compensation resistor R:

$$IS''(t) = \hat{IS}'' e^{-t/\tau}$$

where $\tau$ is a time constant which is determined by the values of the stray and main inductances of the current transformer Tr2, the internal resistance of the d-c source and the compensating resistance. In FIG. 2, $T_A$ means the switching duration of a polarity of the double-throw polarity-reversing switch S1, from which results the period $T_W = 2 \times T_A$ for the a-c supply currents IS' and IS''.

Figure 3:
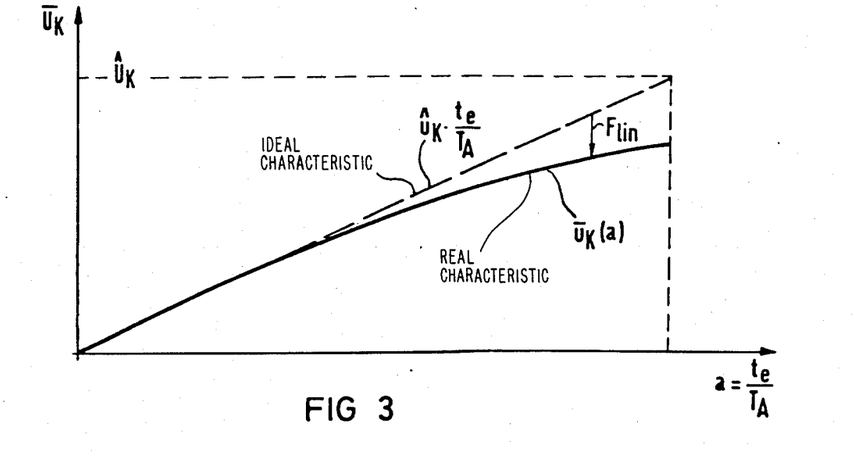

This means that the compensator circuit has a nonlinearity of its display characteristic which no longer satisfies higher accuracy requirements because, according to FIG. 3, the arithmetic mean $\overline{Uk}$ of the compensating voltage Uk is not proportional over a respective "on" duration $T_A$, as required by the principle of pulse duration modulation, to the balancing factor $a = t_e T_A$, the quotient of the "on" time $t_e$ of the compensator resistor R and the switching duration $T_A$.

We rather have $$\overline{Uk}(a) = \frac{1}{T_A} \int_{t_0 = 0}^{t_0 + t_e} \hat{Uk} \, e^{-\frac{t}{\tau}} dt = -\hat{Uk} \cdot \frac{\tau}{T_A} \cdot e^{-\frac{t}{\tau}} \bigg|_0^{t_e}$$

With $\hat{Uk} = IS'' \cdot R$.

The definite integral becomes $$\overline{Uk}(a) = \hat{Uk} \cdot \frac{\tau}{T_A} \left[ 1 - e^{-a \cdot \frac{T_A}{\tau}} \right]$$

and, after a series development of $$\frac{\tau}{T_A} \left[ 1 - e^{-a \frac{T_A}{\tau}} \right]$$

with $a = t_e/T_A$, this becomes $$\overline{Uk}(a) = \hat{Uk} \cdot a \cdot \left[ 1 - \frac{1}{2} \frac{t_e}{\tau} + \frac{1}{6} \left( \frac{t_e}{\tau} \right)^2 - \frac{1}{24} \left( \frac{t_e}{\tau} \right)^3 + \ldots \right]$$

As is shown in FIG. 3, the compensation voltage $\overline{Uk}$ is not proportional to $a = t_e/T_A$ according to the series expression above, but is less than linear with a linearity error $F_{Lin}$ which is the larger, the smaller the time constant of the top slant as compared to the switching duration $T_A$.

On the other hand, the arithmetic mean $\overline{Um}$ is formed by the sum Um of the output voltages $U_{mv}$ of all n measurement variable pickups $DMS_v$ by the known compensator circuit always over the full switching time $T_A$, i.e., $$\overline{Um} = \frac{1}{T_A} \int_0^{T_A} \sum_{\gamma=1}^{n} \hat{Um}_\gamma e^{-\frac{t}{\tau_\gamma}} dt =$$

$$-\frac{1}{T_A} \Sigma \tau_\gamma \cdot \hat{Um}_\gamma \cdot e^{-\frac{t}{\tau_\gamma}} \bigg|_0^{T_A}$$

With this, one gets $$\overline{Um} = \sum_1^n \frac{\tau_\gamma}{T_A} \cdot \hat{Um}_\gamma \cdot \left[1 - e^{-\frac{T_A}{\tau_\gamma}}\right] = \sum_1^n k_\gamma \cdot \hat{Um}_\gamma$$

With $$k_\gamma = \tau_\gamma/T_A \left[1 - e^{-\frac{T_A}{\tau_\gamma}}\right] \text{ and } \hat{Um}_\gamma = c_\gamma \cdot G_\gamma \cdot \hat{IS}_\gamma'$$

where $c_\nu$ means a pickup sensitivity constant. Thus, the mean Um is proportional strictly linearly, because of the purely ohmic networks in the pickups $DMS_\nu$ in spite of the top slants, embodied by, of the individual signals $Um_\nu$ of the sum of the measurement variables $G_\nu$ acting at any instant on the n pickups $DMS_\nu$.

The display indication value A which is proportional to the duty cycle $a=t_e/T_A$ of the known compensator circuit is obtained via the balance condition $$\overline{Uk}(a) = \overline{Um}(\epsilon G_\nu).$$

Because of the underlinearity of $\overline{Uk}$, the known compensator circuit must therefore have as a whole an overlinear display characteristic.

SUMMARY OF THE INVENTION

It is an object of the present invention to improve the evaluation circuit for passive measurement-variable pickups described above in such a manner that it is given a linear display characteristic. The advantages with respect to insensitivity to thermo and contact voltages of the pickups, the compensation-quantity generator, and the input installation, as well as to zero drifts of the amplification are to be preserved.

These and other objects of the present invention are achieved by the evaluation circuits described below.

A first feature of the invention relates to the relocation of the null amplifier NV provided in the known circuit according to FIG. 1 behind the lowpass filter TP, using a directly coupled preamplifier at the present location of the null amplifier. This preamplifier advantageously comprises an output of the network of pickup and compensation resistors delivering the balancing difference voltage or a balancing difference current via a conductor, as well as, optionally, via operational amplifiers connected thereto. It has a linear-phase frequency response beginning at the frequency 0 Hz (passing d-c components), which amplifies wideband beyond the polarity reversal frequency $f_W = \frac{1}{2}T_A$. Its amplitude response need not be particularly flat. The gain can vary within wider limits in periods which are long relative to the clock time $T_A$, without influencing the indication accuracy. Its modulation characteristic, however, must be strictly linear for every frequency in the transmission region. Preferably, the preamplifier has only relatively little gain in order to ensure that it is not operated beyond its modulation limits by capacitive or inductive interference pickups into the input wiring or by noise components of its own as well as zero drifts in the balanced condition of the evaluating device.

A further aspect of the invention relates to the direct coupling of the current flowing through the switchable resistor to the pole reversing switch of the d-c current source. This insures that this current has a strict square-wave form and no top slants causing linearity errors.

Because of the transmission properties of the preamplifier achieved by the invention, the balancing difference signal is amplified so that neither as a result of propogation time distortions nor because of nonlinear drives in the following phase-sensitive rectification process, d-c components falsifying the correct reading can be produced as null errors.

Advantageously, the phase-sensitive rectifier has a strictly linear characteristic which goes exactly through null.

The considerable advantages of using such preamplification with subsequent rectification are, that all interferring d-c components are converted into square-wave voltages of the fundamental frequency $f_W$ of the inverter, i.e., the zero drifts of the preamplifier, thermo voltages and contact potentials of the pickups of the switch-controlled compensation resistance network, as well as the leads to the preamplifier in the phase-sensitive rectifier. Because of the large margin from the frequency zero, they can readily be filtered out effectively by subsequent lowpasses filters.

On the other hand, all noise components suffer during the demodulation process a frequency shift by $\pm \Delta f_W$ of the inverter frequency $f_W$. Thereby, the very disturbing low-frequency noise components of simple semiconductor amplifier input stages, the so-called popcorn or 1/f noise, are shifted to the immediate vicinity of the inverter frequency $f_W$ and can be suppressed equally effectively by the subsequent lowpass filters. Therefore, only the so-called white noise still represents the natural resolution limit of the evaluation circuit according to the invention.

The synchronous control of the phase-sensitive rectifier by the polarity-reversing switch insures that a suppression of the mentioned interferring d-c components sufficient for higher accuracy requirements is obtained in the amplifier balancing difference signal, because thereby, also the selective rectifier is controlled in strict time symmetry.

The generator for the high-frequency pulse sequence is advantageously quartz-stabilized.

The symmetry of two branches of the phase-sensitive rectifier to ground is advantageously made adjustable by a potentiometer.

Advantageously, the measurement-variable pickup bridge circuits are coupled via a conductor to the polarity-reversing switch, besides the switchable resistor.

A similarly advantageous effect is obtained if the measurement-variable pickup bridge circuit and/or the switchable resistor are coupled to the polarity-reversing switch via operational amplifiers or optical couplers.

In a preferred embodiment of the invention, the direct coupling of a measurement-variable pickup bridge circuit and a switchable resistor are realized in that the bridge circuit is coupled with its supply diagonal by a conductor to the pole-reversing switch and is opened at one of its diagonal points. The switchable resistor is inserted into the separating point, the switch contact arm of the double-throw switch replacing the diagonal point at the separation point. The input terminals of the preamplifier are coupled to the measuring diagonal of the measured variable pickup bridge circuit.

In another embodiment, the feed diagonal of the measuring-quantity pickup bridge circuit is coupled via a conductor to the pole-reversing switch. The switchable resistor is connected between ground and the output of a first operational amplifier which has its input terminals coupled to the pole-reversing switch. The measuring diagonal of the measurement-quantity pickup bridge circuit is connected to the input terminals of a second operational amplifier, the output of which is connected to ground via a resistor as well as to an input terminal of the preamplifier. The preamplifier is connected via its other input terminal to the contact arm of a double-throw switch which is connected in the one position to the output of the first operational amplifier, and to ground in the other position. In a further embodiment of the invention, the feed diagonal of the measurement variable pickup bridge circuit is coupled via a conductor to the pole reversal switch. The switchable resistor is connected with its input terminals between the output of a first operational amplifier and ground via the double-throw switch. The measuring diagonal of the measuring-variable pickup bridge circuit is connected to the input terminals of a second operational amplifier, the output of which is connected via a resistor to that input terminal of the preamplifier which is connected to one of the switching contacts of the double-throw switch. The other input terminal of the preamplifier is connected to ground.

The feature of direct coupling is realized in another embodiment of the invention in such a manner that the measuring-variable pickup bridge circuit is shunted on the measuring and feed diagonal side by a second resistance bridge circuit, where the second resistance bridge circuit is opened at a measuring diagonal point and the switchable resistor is inserted into the separation. In this embodiment, the input terminals of the preamplifier are connected to the parallel-connected measuring diagonals of the two resistance bridge circuits. The second resistance bridge circuit can also be replaced by a half-bridge circuit, the arms of which include the switchable resistor.

Still another embodiment of the invention comprises a second resistance bridge which is shunted across the measuring-variable pickup bridge circuit on the feed and measuring diagonal side, which is opened at a feed diagonal point, the separating point being occupied by two contacts of the double-throw switch. The switching contact arm of the double-throw switch is connected to one of the feed diagonal points of the measuring-variable pickup bridge circuit. The input terminals of the preamplifier are connected to the parallel-connected measuring diagonals of the two resistance bridge circuits.

Another embodiment of the invention comprises a switchable resistor which can be shunted by means of the double-throw switch alternatingly across two resistors disposed symmetrically to a diagonal point of the measuring variable pickup bridge circuit, where the input terminals of the preamplifier are connected to the measuring diagonals.

The ratio of the duration of the balancing period $T_A$ to the duration $T_W$ of the inverter and rectifier clock time is an integral number (for instance, 1:2; 2:3; 3:5, etc.).

BRIEF DESCRIPTION OF THE DRAWINGS

In addition to FIGS. 1 to 3, which aid in an understanding of the shortcomings of the state of the art and have already been discussed, various embodiments of the invention are shown in the additional drawing figures in which:

FIGS. 5a, b and c show the voltage waveforms appearing at characteristic switching points of the circuit according to FIG. 4;

DETAILED DESCRIPTION

Figure 7:
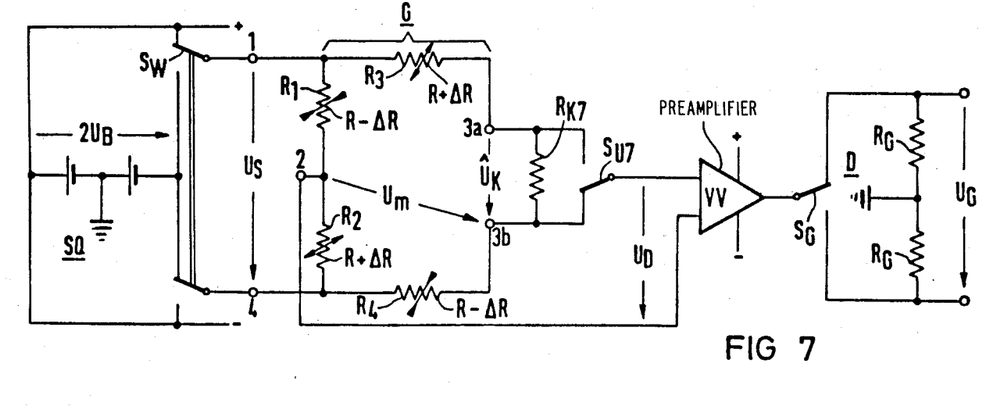
FIGS. 7 to 13 illustrate different embodiments of direct coupling of the pickup and compensation network to the inverter or pole reversing switch of FIG. 4.
Figure 8:
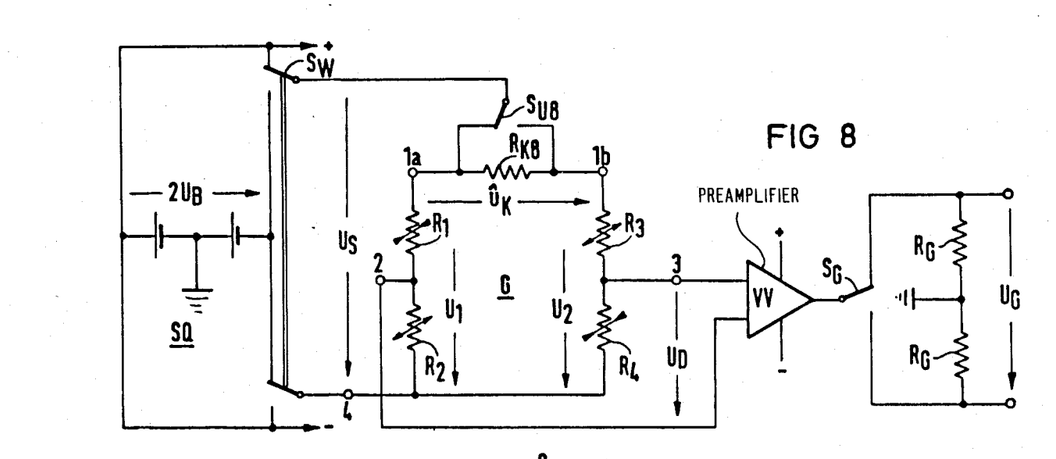
Figure 9:
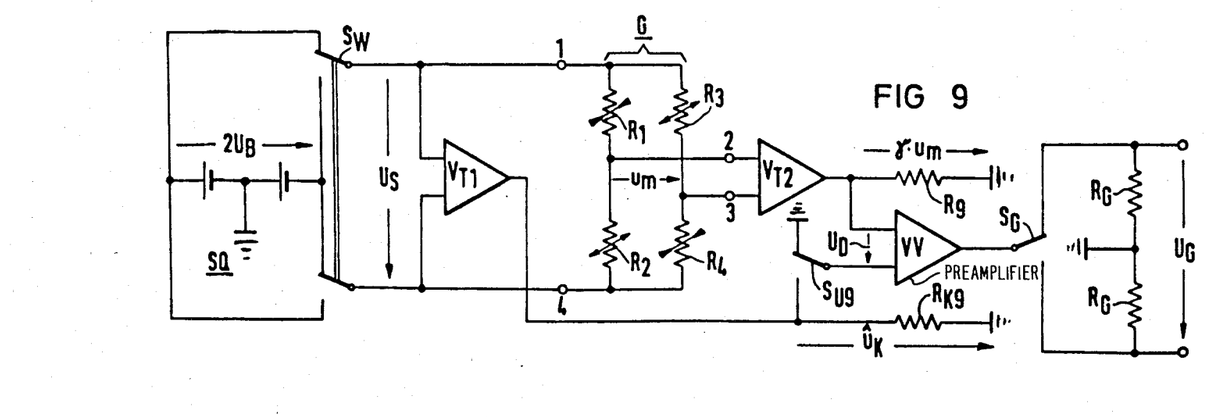

The circuits according to FIGS. 7 to 9 follow the principle of voltage compensation; in the circuits according to FIGS. 10 to 13, on the other hand, the principle of current compensation is used.

Figure 4:
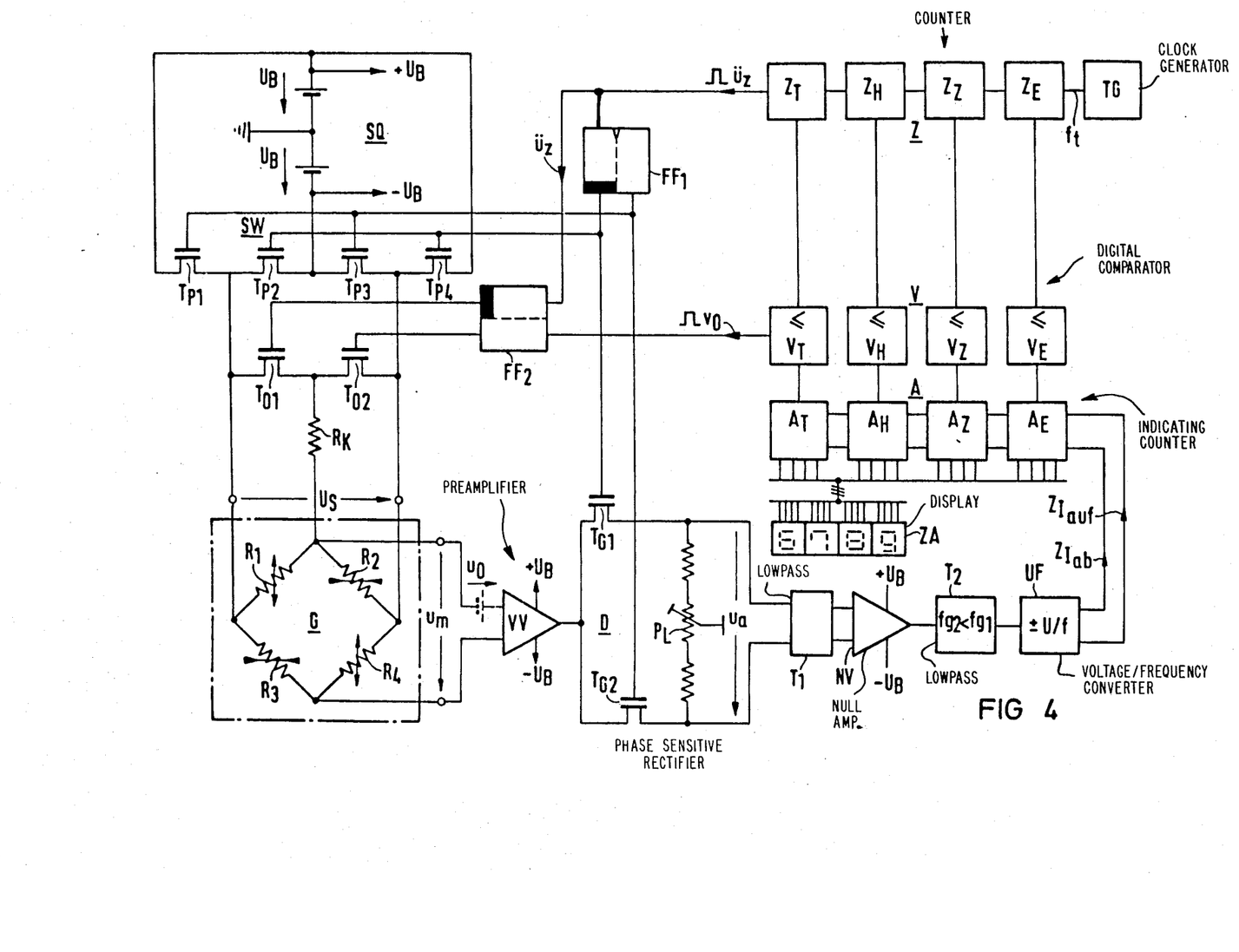
FIG. 4 is a block diagram of an embodiment of the invention in which detuning compensation is used.

With reference to the drawings, in FIG. 4, a preferably ground-symmetrical voltage source SQ is connected via switching gaps $T_{P1}...T_{P4}$ which form a pole reversal switch or inverter SW, to a measurement variable pickup G which is shown as a pickup measuring bridge with four variable resistors $R_1$–$R_4$. Via switching gaps $T_{O1}$ and $T_{O2}$, a balancing resistor $R_K$ can be shunted alternatingly across the measuring-bridge resistors $R_1$ and $R_2$. The switching gaps $T_{P1}...T_{P4}$ of the pole-reversing switch or inverter are controlled by output signals of a flip-flop $FF_1$. One dynamic input of the flip-flop $FF_1$ is connected to an output for an overflow signal $ü_z$ of a counter Z which is addressed by clock pulses of a clock generator TG. Bit outputs of a clock pulse counter Z are connected to corresponding inputs of a digital comparator V, the comparison bit inputs of which are connected to bit outputs of an indicating counter A. An output of the comparator V carries a signal Vo if the counter readings of the counters Z and A are equal, and is connected to one of the control inputs of a second flip-flop $FF_2$. The other control input of the flip-flop $FF_2$ is connected to the output of the counter Z which delivers the overflow signal $ü_z$. The two outputs of the flip-flop $FF_2$ are connected to a control input of each of one of the switching gaps $T_{O1}$ and $T_{O2}$.

The measuring or output diagonal of the pickup G is connected to inputs of a preamplifier VV. The output of this preamplifier VV is connected to the input of a phase-sensitive rectifier D which comprises substantially switching gaps $T_{G1}$ and $T_{G2}$. Control inputs of the switching gaps $T_{G1}$ and $T_{G2}$ are connected to two outputs of the flip-flop $FF_1$ carrying mutually inverted signals and which control at the same time the switching gaps of the pole-reversing switch or inverter SW. The two branches of the phase-sensitive rectifier D can be centered via a potentiometer PL which couples both branches. The output of the phase-sensitive rectifier D is connected via a first lowpass stage $T_1$ to the input of a post-amplifier NV which acts as a d-c voltage null amplifier. The output of amplifier NV is connected via a second lowpass stage $T_2$ to the input of a voltage/frequency converter UF. Depending on the polarity of the input voltage of the voltage/frequency converter, one of two outputs of the voltage/frequency converter carries signal. The two outputs are connected to corresponding inputs for forward and back counting of the indicating counter A. Bit outputs of the indicating counter A are connected to corresponding outputs of a numerical display ZA.

The operation of the circuit now will be described in the following.

By means of the switching gaps $T_{P1}...T_{P4}$ of the pole reversal switch or inverter SW, the squarewave supply voltage $U_S$ with the exact duty cycle 1:1 for supplying a measurement variable pickup G is derived from the ground-symmetrical supply voltage $\pm U_B$ of the voltage source SQ for the electronic modules of the evaluation circuit which is stabilized only against short-time voltage fluctuations. The latter, neglecting the voltage drops across the inverter switching gaps $T_{P1}...T_{P4}$, has an amplitude $2U_B$ and a period of $T_w=2\,T_A$. The time required to count up the clock pulse counter Z by the pulses supplied by the short-time stabilized clock generator TG with the sequence frequency $f_t$ from 0 to its maximum value $Z_{max}$ is $T_A$. The overflow pulse $\ddot{u}_z$ furnished by the counter Z after it is full, for one, sets the clock pulse counter Z itself back to 37 0" and acts at the same time on the dynamic input of the flip-flop $FF_1$ which is thereby given its switching state after the expiration of the time $T_A$. Thereby, the switching gaps $T_{P2}$ and $T_{P4}$ of the inverter SW or pole-reversing switch is switched into conduction alternatingly for an $n^{th}$ clock time $T_{An}$ and for the subsequent clock time $T_{An+1}$, so that a squarewave voltage $U_S$ with the required exact duty cycle 1:1 is available at the feed diagonal of the measuring value pickup G. In rigid phase and strictly synchronously with the switching gaps $T_{P1}...T_{P4}$ of the inverter, also the switching gaps $T_{G1}$ and $T_{G2}$ of the phase-sensitive rectifier D are switched into conduction alternatingly from the respective position of the flip-flop $FF_1$ for the duration of the time $T_A$. The phase-sensitive rectifier D demodulates the output voltage of the preamplifier VV.

The preamplifier VV is coupled d-c-wise to the measuring diagonal of the measurement value pickup G and works as a linear-phase wideband amplifier with a highly linear drive characteristic from a frequency of 0 Hz on. It, therefore, amplifies the pickup measurement voltage $u_m$ which, besides undesirable d-c interference components consisting of thermo voltages and contact potentials, has exclusively a-c components, the fundamental frequency of which is $$f_w = \frac{1}{T_w} = \frac{1}{2T_A}$$

and otherwise consists of its harmonics. The preamplifier VV further amplifies undesired d-c components which result from current and voltage zero drifts of the preamplifier VV itself. The effect of these zero drifts is combined in an equivalent voltage $u_0$ together with the thermo and contact voltages of the pickup and compensation network. In addition, the preamplifier VV amplifies all noise voltage components which are generated mainly in the input stage of the preamplifier VV and also as white resistance noise in the pickup and compensation network.

All interferring d-c components are transformed in the highly linear, phase-sensitive rectifier V which is connected strictly symmetrically into squarewave voltages with the fundamental frequency $f_w$ which, because of their large distance from the frequency 0 Hz can be filtered out easily and effectively in the following lowpass stages $T_1$ and $T_2$ in spite of their relatively high frequency limit.

Equally advantageous is another result of the operation of the new circuit which consists in that the noise components of the output signal of the preamplifier VV all are subjected to a frequency shift by $\pm f_w$ during the demodulation process. Thereby, the otherwise very disturbing low-frequency noise components, particularly of simple semiconductor amplifier input stages, the so-called popcorn or 1/f noise, are shifted to the immediate vicinity of the inverter frequency $f_w$ and can, therefore, likewise be suppressed effectively by the subsequent lowpass stages $T_1$ and $T_2$. The noise components of the so-called white noise, which are smaller by orders of magnitude, are not suppressed. Only this kind of noise, therefore, represents the natural resolution limit of the new evaluation circuit which can be approached practically as far as desired already with very inexpensive operational amplifiers. This limit is, for instance, at about 10 to 30 nV, depending on the internal resistance of the measurement-variable pickup and the choice of the lowpass frequency limit.

Measuring-voltage components in $u_m$ stemming from a detuning dependent on the measurement quantity of the measurement variable pickup, $$\frac{\Delta R}{R} = \frac{b\,\Delta R_{max}}{R},$$

have a rectangular voltage waveform with an amplitude of $$b\hat{U}_m = \frac{b \cdot \Delta R_{max}}{R} \cdot U_S,$$

which is exactly in phase with $U_S$ because the pickup and compensation network is designed of purely ohmic resistances. Here, $\Delta R_{max}/R$ is the detuning change of the pickup measuring bridge which the measurement variable causes thereto upon reaching the end value of its measuring range. The factor b, therefore, indicates the degree of drive of this measuring range. It can, therefore, assume values between 0 and 1. The squarewave voltage $b \times U_m$ is transformed, after preamplification by VV, and rectification by the phase-sensitive rectifier D, with the correct sign into a proportional d-c voltage which can pass the lowpass $T_1$ and, after postamplification by the post-amplifier NV, can pass also the lowpass $T_2$ unimpeded and is transformed, with valuation with the correct sign in the subsequent voltage/frequency converter UF into pulse sequences $z_{Iauf}$ and $z_{Iab}$ having a sequence frequency proportional to the respective residual detuning of the measurement-variable pickup.

The counter pulses $Z_{Iauf}$ and $Z_{Iab}$ generated in this process serve to change the instantaneous counter content of the indicating counter A with its counting decades (four in the embodiment example), $A_T$, $A_H$, $A_Z$ and $A_E$, in the sense of an approximation to the balanced state of the measuring circuit given by b in the up or down direction.

It has already been mentioned that it is of decisive importance for the linearity and long-term stability of the display characteristic of the evaluation circuit that the preamplifier VV has a drive characteristic which, at least in the frequency range $f_w - f_{dynmax}$ to $f_w + f_{dynmax}$ must be strictly linear but not long-term stable, and that the phase-sensitive rectifier D operates strictly symmetrically and likewise with a highly linear characteristic. It is, therefore, advisable to provide in the phase-sensitive rectifier D a possibiity for fine adjustment of this symmetry by means of a trimmer potentiometer PL. It is vice versa possible to introduce intentionally an asymmetry by means of this adjustment possibility, should the pickup characteristic have an even-numbered curvature section. In the interaction of the measurement pickups and the evaluation circuit, a very simple but highly effective linearity adjustment can be achieved in this manner. Such a linearity adjustment is recommended particularly if the evaluation circuit has, beyond the four counting decades shown in FIG. 4, a still greater digital measurement-value resolution due to a larger number of counting decades.

With the presently existing possibilities of digital circuit technology, a resolution of between $10^5$ to $10^6$ can be achieved, so that the use of 5 to 6 counting decades is practical.

In case of increased resolution, it also makes sense to use a variant of the embodiment shown in FIG. 4 which eliminates the influence of propagation time fluctuations of the preamplifier VV as well as of the finite switching time and the charge reversal effects of the switching paths for the balancing resistor $R_K$. For this purpose, the measuring pickup supply voltage $U_S$ is set to "0" for a short time $t_{u1}$ by a suitably laid-out control after the occurrence of an overflow signal $u_z$ by blocking the last-conducting inverter switching gaps $T_{P1}$, $T_{P3}$ and $T_{P2}$, $T_{P4}$, respectively. In this voltage-free state, the resistor $R_K$ is switched over, at the end of $t_{u1}$ by the switching gap $T_{01}$ or $T_{02}$, and likewise, the phase-sensitive rectifier D is switched over.

Only at the end of a further short-time interval $t_{u2}$, the supply voltage $U_S$ is then switched on again with reverse polarity via the complementary inverter switching gaps.

It is further pointed out that in the embodiment shown in FIG. 4, counting, comparison and control problems solved by idividual switching elements can optionally be solved by a microprocessor which may already be provided and required for other problems. Thereby the part of the evaluation circuit which is specific to the problem can be reduced substantially. This allows a logical integration in a customer circuit which can be employed very flexibly.

Figure 5:
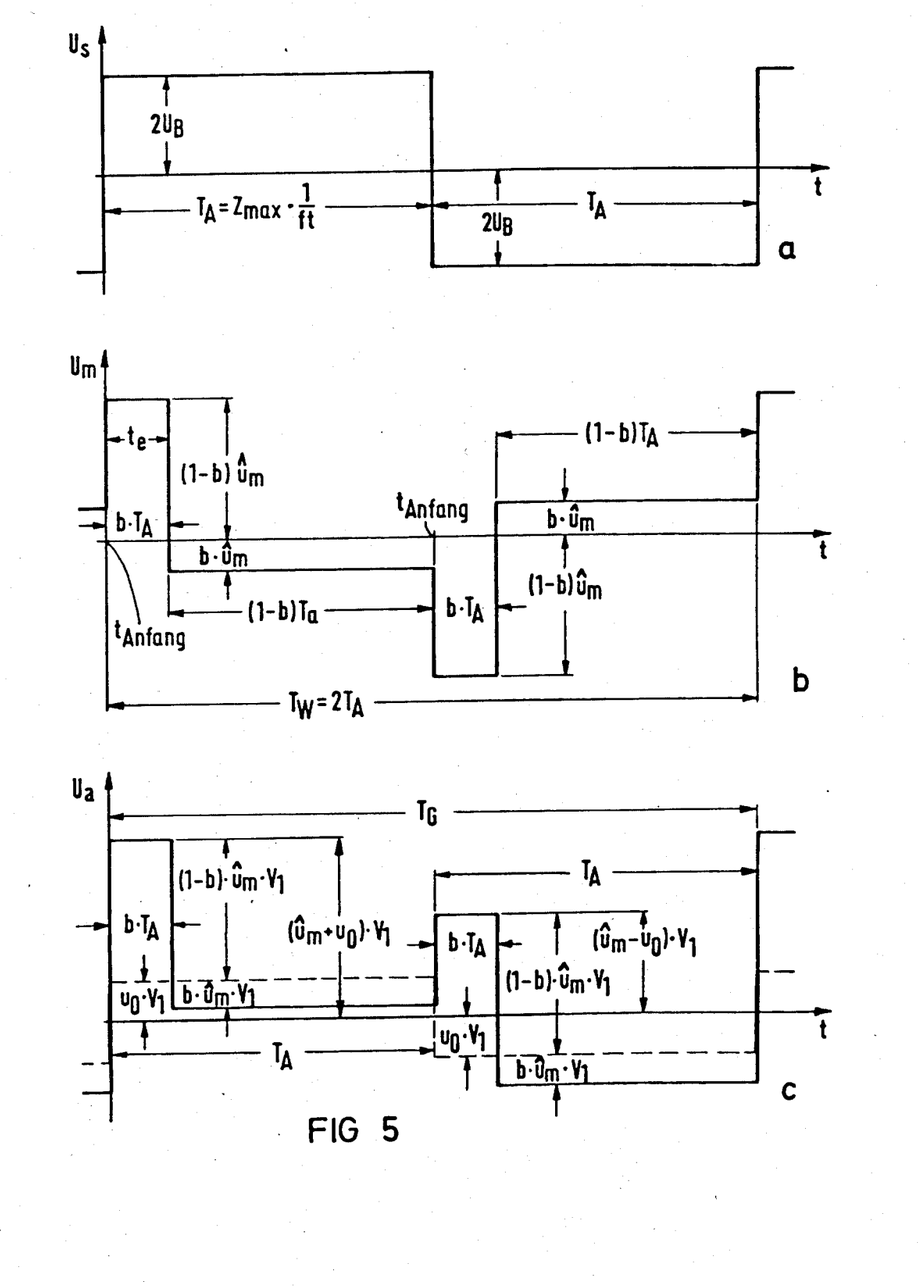

In diagram a of FIG. 5, the waveshape of the supply voltage $U_S$ of the measuring pickup is shown along the time axis t. The amplitude of the squarewave a-c voltage which is generated by pole reversal is $2 U_B$. The period of the a-c voltage is $2 T_A$. The half-period TA is the product of the maximum content $Z_{max}$ of the counter Z divided by the repetition frequency $f_t$ of the counting pulses arriving at the counter Z.

In diagram b of FIG. 5, the waveshape of the output voltage $u_m$ of the network of pickup and compensation resistors is plotted, to facilitate understanding, under the assumption that a bridge detuning of the measuring pickup is exactly compensated by the measuring variable by $b (\Delta R_{max})/R$ by a clocked reversal of the resistor $R_K$ for an "on" time $t_e$ of $b \times T_A$ and the balancing process required therefor is completed. For this balancing process we have for every balancing cycle, independently of the polarity of the measuring pickup supply voltage $U_S$, that the integral determining the arithmetic mean value $\overline{u_{mo}}$ of the output voltage $u_{mo}$ of the measuring circuit from the instant $t_{anfang}$ over a full clock cycle $T_A$ $$\overline{u_{mo}} = \frac{1}{T_A} \cdot \int_{t_{anfang}}^{t_{anfang} + T_A} u_m(+) \, dt = 0$$

no longer has a d-c component. If, after amplification of $u_{mo}$, initially assumed as ideal by the preamplifier, the amplified signal is reversed exactly at the times $t_{anfang}$ by the preamplifier by the phase-sensitive rectifier likewise acting as a controlled pole reverser, the amplified signal is reversed always exactly at the times $t_{anfang}$ and therefore no d-c component can appear in the output voltage $u_a$ of the phase-sensitive rectifier D formed in this manner of these a-c components of $u_{mo}$, which could pass through the lowpasses $T_1$, $T_2$ and would, therefore, influence the balancing value of the evaluation circuit incorrectly. This, however, would be very likely to happen if the phase-sensitive rectifier were polarity reversed at times which do not coincide exactly with $t_{anfang}$. From this comes the requirement for an extremely time-exact control of the demodulator D which is assigned in rigid phase relationship to the pole reverser of the supply voltage.

In diagram c of FIG. 5, the real waveform of the demodulated output voltage $u_a$ of the preamplifier VV found in reality is plotted in case of a drive on the input side by a measuring circuit output voltage $u_m(t)$ corresponding to diagram b and simultaneous superposition of this voltage $u_m(t)$ by a d-c component $u_o$ due to zero drifts of the preamplifier VV as well as the thermo and contact voltages in the measuring circuit. Both signal components appear at the output of the preamplifier, magnified by the gain $V_1$ of the latter.

It can be seen that in the balanced state, the demodulated signal no longer has any d-c components influencing the balanced value in spite of all disturbing influences, since the demodulator chops the amplified d-c interference voltages into squarewave a-c voltages with the fundamental frequency $f_w$. A condition for this is that the demodulator D has a strictly linear characteristic which goes exactly through 0.

Figure 6:
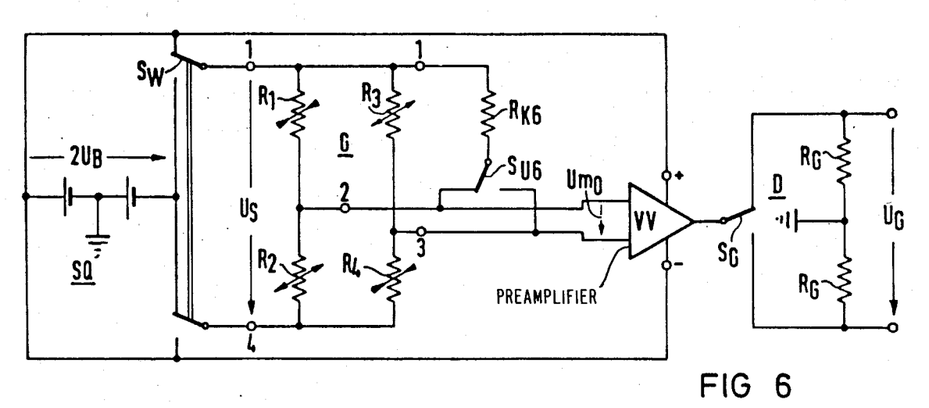
FIG. 6 shows a modification of part of the circuit shown in FIG. 4.

In FIG. 6, a further embodiment for a directly coupled measuring-variable pickup G and a compensating resistor $R_{K6}$ is shown, in which detuning compensation is used.

To a supply voltage source SQ with the voltage $2 U_B$ is connected a pole-reversing switch SW which supplies the supply diagonal of a measuring-variable pickup G with a squarewave voltage $U_S$. The measuring-variable pickup G consists of a bridge circuit of four resistors $R_1 \ldots R_4$ which vary with a measurement variable. The terminals of this bridge circuit are designated by $1 \ldots 4$. Deviating from the circuit according to FIG. 4, a compensation resistor $R_{K6}$, with which a detuning compensation of the output signal of the measurement variable pickup G is produced, is permanently connected not to a corner of the output diagonal, but to a supply diagonal point. By means of a double-throw switch $S_{U6}$, the compensation resistor $R_{K6}$ can alternatingly be connected to both diagonal points 2, 3 of the output diagonal and thereby can be shunted across one of the bridge resistors $R_1$ and $R_3$, respectively. Through this reversal, the balancing factor a is controlled so that the detuning $\Delta R/R$ of the measurement variable pickup bridge G is just made 0 in the mean value as a function of time by counter-detuning the bridge. The instantaneous magnitude of the detuning is determined by means of the no-load measuring voltage $u_{mo}$ which is produced at the output diagonal of the measuring variable pickup G and is amplified in the preamplifier VV. At the output of the preamplifier VV, the supply voltage of which comes from the voltage source SQ, is connected a further double-throw switch contact $S_G$ which together with two resistors $R_G$ serving for symmetrizing, form the phase-sensitive rectifier or demodulator D. The output voltage $U_G$ of the demodulator D is further processed as in the embodiment of FIG. 4. The double-throw switches SW, $S_{U6}$ and $S_G$ are controlled in the same manner as the switching elements $T_{P1} \ldots T_{P4}$, $T_{O1}$ and $T_{O2}$ or $T_{G1}$ and $T_{G2}$ which are shown in FIG. 4 as semiconductor switches, for instance, MOS-FET transistors.

A further embodiment of the measuring variable pickup, preamplifier and phase-sensitive rectifier arrangement with the associated double-throw switches and a compensation resistor is shown in FIG. 7. Components of similar significance are designated with the same reference symbols as in the circuit according to FIG. 6. The measuring variable pickup G again comprises four resistors $R_1 \ldots R_4$ connected together to form a Wheatestone bridge circuit, the supply diagonal points 1 and 4 of which are connected to a supply Voltage $U_S$ and which are connected via the periodically switchable double-throw switch SW, to the supply source SQ having the d-c voltage 2UB. At the output diagonal point 3 of the measuring-variable pickup bridge G, the bridge is cut open and a compensating resistor $R_{K7}$ is inserted into the separation 3a, 3b. The measurement variable pickup G is shown here as a full bridge circuit; it is understood, however, that also a quarter or a half-bridge circuit can be used. The bridge points 3a and 3b can be connected alternately to the one input of the preamplifier VV by means of a double-throw switch $S_{U7}$; its other input is connected to the output diagonal point 2 of the measuring variable pickup G. The divider voltage dropping across the resistor $R_{K7}$, $$\hat{U}_K = U_S \frac{R_{K7}}{2R + R_{K7}}$$

is connected in bucking fashion by switching $S_{U7}$ at the duty cycle $a = t_e/T_A$ of the measuring-pickup voltage um according to the principle of voltage compensation.

The rest, not shown, of the circuit for evaluating the output voltage of the phase-sensitive rectifier D as well as for the control of the double-throw switches corresponds to the details shown in FIG. 4.

A circuit which largely agrees with the circuit according to FIG. 7 is shown in FIG. 8. It differs from the circuit according to FIG. 7 in that the feed diagonal point 1 of the measurement quantity pickup bridge G is separated and a compensation resistor $R_{K8}$ is inserted at the separation point 1a, 1b. A double-throw switch $S_{U8}$ connects alternately one of the points 1a or 1b to the output voltage of the polarity reversing switch SW. Also the circuit according to FIG. 8 represents a voltage compensation. The input voltage $u_D$ for the preamplifier is $u_D = U_1 - U_2 = u_m - a \cdot u_K$.

In FIG. 9, a further measuring-variable pickup compensation and rectifier arrangement is shown which operates according to the principle of a voltage compensation. The voltage $u_m$ at the output diagonal of the measurement variable pickup G is amplified via an operational amplifier $V_{T2}$. A compensation resistor $R_{K9}$ is connected via another operational amplifier $V_{T1}$ to the output voltage $U_S$ of the polarity-reversing switch SW. One of the input terminals of the preamplifier VV is connected to the output of the operational amplifier $V_{T2}$; the other input terminal is acted upon alternately via a double-throw switch $S_{U9}$ by the voltage drop $U_K$ at the compensation resistor $R_{K9}$ and ground potential. The input voltage of the preamplifier VV is represented by $$u_D = v \cdot u_m - a \cdot \hat{u}_K,$$

where v is the gain of the operational amplifier $V_{T2}$.

Figure 10:
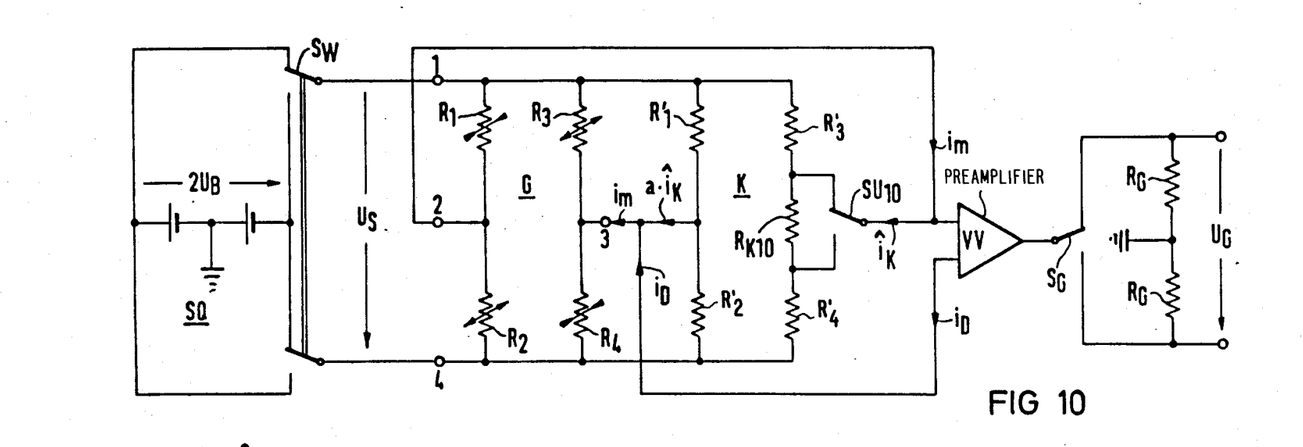

In FIG. 10, an embodiment of a circuit for a measurement-variable pickup and compensation network is shown which operates according to the principle of current compensation. To this end, a measurement quantity pickup bridge circuit G and a compensation bridge circuit K which comprises four resistors $R_1, \ldots R_4$ and a switchable resistor $R_{K10}$ are connected with their feed diagonals and output diagonals in parallel. On the feed side, both are connected to the polarity-reversing switch SW and, therefore, to its output voltage $U_S$. One of the output diagonal points of the compensation bridge K is cut open and between the separation points is inserted the switchable resistor $R_{K10}$, the two terminal points of which are connected alternately to the one input of the preamplifier VV by a double-throw switch $S_{U10}$. The other input of the preamplifier VV is connected to two output diagonal points, connected to each other, of the two bridge circuits G and K. In this circuit arrangement, a short-circuit current $i_m$ from the measuring diagonal of the measurement quantity pickup bridge G is compensated by the short circuit current $i_k$ of the compensation bridge circuit K. In the interest of a small effect on the pickup bridge circuit and light loading of the current source SQ, all bridge resistors of the compensation bridge circuit K are of high resistance.

Figure 11:
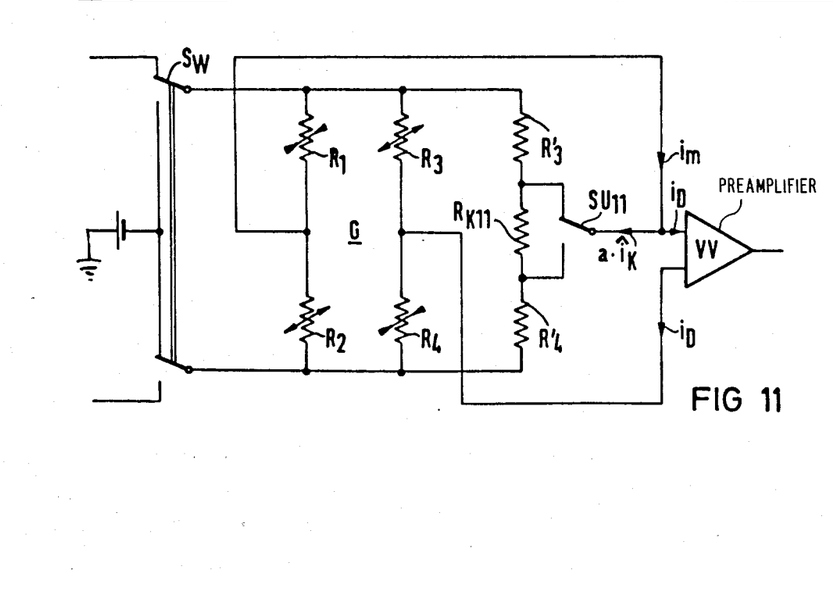

A variant of the circuit according to FIG. 10 is shown in FIG. 11. The bridge circuit K has been reduced here to a half-bridge comprising the resistors $R_3$, and $R_4$, with the inserted switchable resistor $R_{K11}$. This variant is simply obtained if the resistors $R_1$, and $R_2$, of the circuit according to FIG. 10 are made infinite.

Figure 12:
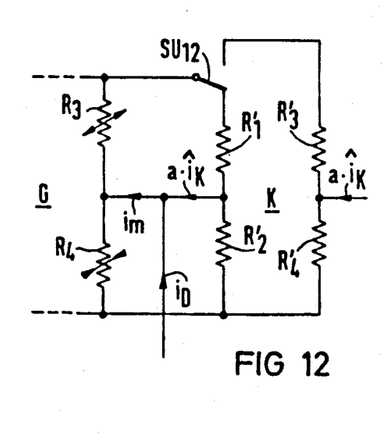

A further embodiment, in which current compensation with a compensation-bridge circuit finds application, is schematically shown in FIG. 12. Only the compensation bridge K comprising the the resistors $R_1, \ldots R_4$, and their connection to the bridge arm comprising the resistors $R_3$ and $R_4$ of the measurement variable pickup bridge G are shown. A switch $S_{U12}$ allows the connection of the compensation bridge circuit K to the feed voltage in the rhythm of the balancing factor $a = -t_e/T_A$.

Figure 13:
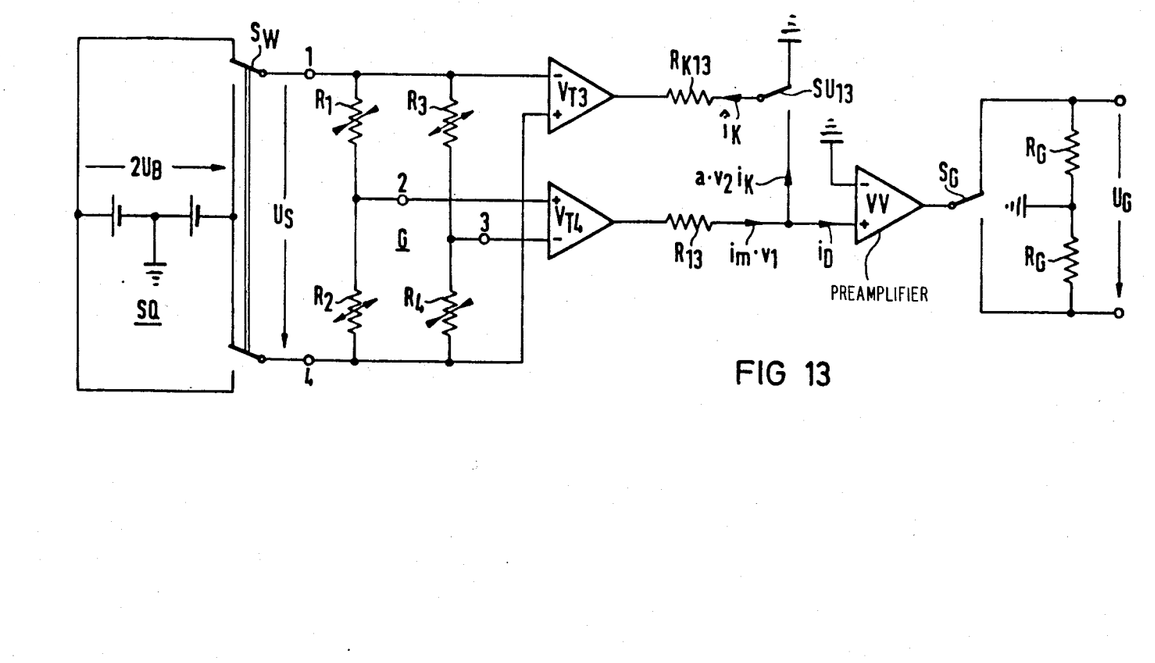

In FIG. 13 is further shown an example of a current compensation network for the measuring variable pickup output signal. The output diagonal points 2 and 3 of the measurement variable pickup bridge circuit G are connected to the two inputs of an operational amplifier $V_{T4}$, the output of which is connected via a resistor R13 to the one input of the preamplifier VV. The periodically switched feed voltage $U_S$ is connected to the inputs of a further operational amplifier $V_{T3}$, the output of which can be connected via a resistor and a double-throw switch $S_{U13}$ alternatingly to ground and the already mentioned input of the preamplifier VV. The other input of the preamplifier VV is connected to ground.

All the embodiments described exhibit the feature of a coupling which passes d-c of the measuring variable pickup network and the compensation network at the polarity-reversing switch SW. There are possibilities, other than those shown, for the design of the compensation networks. It is possible to derive from the basic solutions described herein, mixed circuit arrangements, in which the measures described, on which the invention is based, are likewise applied.

What is claimed is:

1. In an evaluation circuit for a passive measurement variable pickup, the pickup having ohmic sensor resistor means disposed in a bridge circuit having a feed diagonal and an output measurement diagonal, said circuit further having clock pulse counter means, digital comparator means, sign sensitive voltage to frequency converter means, phase-sensitive rectifier means, low pass filter means and balancing adjustment means for adjusting an output signal of the pickup, said adjustment means including switching means having first and second switching positions and providing duration-modulated switching via said switching means of a switchable resistor into said first and second switching positions, said resistor being switched into said first position by an overflow signal from said clock pulse counter means and into said second position by an output signal of said digital comparator means, said digital comparator means comprising the contents of the clock pulse counter means and of said sign sensitive voltage of frequency converter means, an input voltage of the voltage to frequency converter means comprising an amplified balancing difference signal which is rectified by said phase-sensitive rectifier means and filtered by said lowpass filter means, the bridge circuit and the switchable resistor being fed by a polarity-reversing switch means controlled by the overflow signal of said clock pulse counter means from at least one of a d-c current and voltage source, the phase-sensitive rectifier means being controlled synchronously with the polarity-reversing switch means, the improvement comprising:

preamplifier means for amplifying the balancing difference signal, said preamplifier means further transmitting d-c components of said balancing signal, an output of said preamplifier means being coupled to an input of the phase-sensitive rectifier means, said preamplifier means having a linear phase frequency response in the transmission bandwidth of said preamplifier means and further having an amplitude independent gain characteristic, thereby preventing modulation of said balancing signal;

null amplifier means coupled to an output of said rectifier means; and means for passing d-c components coupling said switchable resistor to said polarity-reversing switch means.

2. The improvement recited in claim 1, wherein said phase-sensitive rectifier means has a strictly linear demodulation characteristic such that an output voltage of the rectifier means is linearly related to an input voltage and such that for a zero input voltage, the output voltage is zero.

3. The improvement recited in claim 1, wherein at least one of the measuring variable pickup bridge circuit and the switchable resistor are coupled to the polarity-reversing switch means via a conductor.

4. The improvement recited in claim 1, wherein at least one of the measurement variable pickup bridge circuit and the switchable resistor are coupled to the polarity-reversing switch means by operational amplifier means.

5. The improvement recited in claim 1, wherein at least one of the pickup bridge circuit and the switchable resistor are coupled to the polarity-reversing switch means via optical coupling means.

6. The improvement recited in claim 3, wherein the measurement variable pickup bridge circuit has an input diagonal coupled by a conductor to the polarity-reversing switch means, said bridge circuit being separated at one of its diagonal points, the switchable resistor being disposed across the separation thus formed, said switching means comprising double throw switching means having a switching contact arm means and two contact means alternately coupled to said contact arm means, said contact means coupled to said resistor, said switching contact arm means replacing said separated diagonal point, an input terminal of the preamplifier means being coupled to the output measurement diagonal of the measurement-variable pickup bridge circuit.

7. The improvement recited in claim 4, wherein the feed diagonal of the measurement-variable pickup bridge circuit is coupled to the polarity-reversing switch means by a conductor, the switchable resistor being coupled between a point of constant potential and an output of a first operational amplifier means having input terminals coupled to the polarity-reversing switch means, the measuring diagonal of the measurement variable pickup bridge circuit being coupled to input terminals of a second operational amplifier means having an output coupled to a point of constant potential, said output of said second operational amplifier means further being coupled to an input terminal of the preamplifier means, another input terminal of said preamplifier means coupled to a contact arm means of said switching means, said switching means comprising double-throw switching means, said switching means coupling said contact arm in a first position to the output of the first operational amplifier means and in a second position to a point of constant potential.

8. The improvement recited in claim 4, wherein the feed diagonal of the measurement variable pickup bridge circuit is coupled to the polarity-reversing switch means by a conductor, said switching means comprising a double throw switching means, the switchable resistor being coupled to an output of a first operational amplifier means and to a point of constant potential by said double-throw switching means, said first operational amplifier means having input terminals coupled to the polarity-reversing switch means, the measuring diagonal of the measurement variable pickup bridge circuit being coupled to input terminals of a second operational amplifier means, an output of said second operational amplifier means being coupled to an input terminal of the preamplifier means, said input terminal further being coupled to said double-throw switching means, another input of the preamplifier means being coupled to a source of constant potential.

9. The improvement recited in claim 3, wherein the feed and output diagonals of the measurement variable pickup bridge circuit are shunted by a second resistance bridge circuit, the second resistance bridge circuit having a separated measuring diagonal, the switchable resistor being inserted into the separation thus formed, the input terminals of the preamplifier means being coupled to the parallel-coupled output diagonals of said two resistance bridge circuits.

10. The improvement recited in claim 9, wherein the second resistance bridge circuit comprises a half-bridge circuit having two resistance arms, the switchable resistor being disposed in series between said two resistance arms.

11. The improvement recited in claim 3, wherein the feed diagonal and the output diagonal of the measurement variable pickup bridge circuit are shunted by a second resistor bridge circuit having a separated feed diagonal, said switching means comprising double-throw switching means disposed across the separation, said double throw switching means having a switching contact arm means, the switching contact arm means being coupled to the measurement variable pickup bridge circuit, input terminals of the preamplifier means being coupled to the parallel-coupled output diagonals of said two resistance bridge circuits.

12. The improvement recited in claim 3, wherein the switchable resistor is shunted by the switching means alternatingly to two resistors of the measurement variable pickup bridge circuit which are symmetrical to a diagonal point of said bridge circuit, the input terminals of the preamplifier means being coupled to the output diagonal.

13. The improvement recited in claim 1, wherein said clock pulse counter means is driven by a quartz stabilized clock pulse generator means.

14. The improvement recited in claim 2, further comprising potentiometer means for providing a symetrical output forms said phase sensitive rectifier means.

15. The improvement recited in claim 1 wherein said switching means and said polarity reversing switch means comprise semiconductor switching means.

16. The improvement recited in claim 6 wherein said switching means and said polarity reversing switch means comprise semiconductor switching means.

17. The improvement recited in claim 7 wherein said switching means and said polarity reversing switch means comprise semiconductor switching means.

18. The improvement recited in claim 8 wherein said switching means and said polarity reversing switch means comprise semiconductor switching means.

19. The improvement recited in claim 11 wherein said switching means and said polarity reversing switch means comprise semiconductor switching means.

* * * * *